United States Patent

Baschirotto et al.

[19]

[11] Patent Number: 5,973,537
[45] Date of Patent: Oct. 26, 1999

[54] COMMON MODE CONTROL CIRCUIT FOR A SWITCHABLE FULLY DIFFERENTIAL OP-AMP

[75] Inventors: Andrea Baschirotto, Tortona; Angelo Nagari, Cilavegna; Rinaldo Castello, Arcore, all of Italy

[73] Assignee: SGS-Thomson Microelectronics S.r.l., Agrate Brianza, Italy

[21] Appl. No.: 08/948,986

[22] Filed: Oct. 10, 1997

[30] Foreign Application Priority Data

Oct. 11, 1996 [EP] European Pat. Off. .............. 96830523

[51] Int. Cl.[6] ..................................................... H03K 5/00
[52] U.S. Cl. .......................... 327/337; 327/554; 330/253; 330/258
[58] Field of Search .................................... 327/337, 554, 327/558; 330/253, 258; 341/172

[56] References Cited

U.S. PATENT DOCUMENTS

| | | | |
|---|---|---|---|
| 4,697,152 | 9/1987 | Westwick | 330/9 |
| 4,720,686 | 1/1988 | Westwick | 330/258 |
| 4,794,349 | 12/1988 | Senderowicz et al. | 330/253 |
| 5,359,294 | 10/1994 | Ganger et al. | 330/258 |
| 5,391,999 | 2/1995 | Early et al. | 327/337 |

FOREIGN PATENT DOCUMENTS

3725323 A1  2/1988  Germany .......................... H03F 3/45

OTHER PUBLICATIONS

Malcovati et al., Proceedings of the Midwest Symposium on Circuits and Systems, Lafayette, Aug. 3–5, 1994, vol. 1, No. SYMP. 37, pp. 93–96, "Design of Analog Blocks for Low–Voltage Switched Systems".

Crols et al., IEEE Journal of Solid–State Circuits, Aug. 1, 1994, vol. 29, No. 8, pp. 936–942, "Switched–Opamp: An Approach to Realize Full CMOS Switched–Capacitor Circuits at Very Low Power Supply Voltages".

Castello et al., IEEE Journal of Solid–State Circuits, Dec. 1995, vol. 20, No. 6, pp. 1122–1132, "A High–Performance Micropower Switched–Capacitor Filter".

Primary Examiner—Tuan T. Lam
Attorney, Agent, or Firm—Allen, Dyer, Doppelt, Milbrath & Gilchrist, P.A.

[57] ABSTRACT

In switch-capacitor systems for extremely low supply voltage, employing a fully differential switched op-amp, proper functioning of nMOS switches coupled to the inverting input node of an integrated stage capable of outputting a common mode control signal is made possible by retaining the ground potential on the input node to prevent body effects on the threshold of nMOS switches by means of an auxiliary switched capacitor.

9 Claims, 1 Drawing Sheet

COMMON MODE CONTROL CIRCUIT FOR A SWITCHABLE FULLY DIFFERENTIAL OP-AMP

FIELD OF THE INVENTION

The present invention relates to switched-capacitor (SC) circuits particularly for low voltage supply and low power consumption applications, and, more particularly, to circuits using a switched Op-AMP with a differential output, thus requiring control of the common mode.

BACKGROUND OF THE INVENTION

Switched-capacitor circuits are widely used for signal processing because of their low distortion and because they are simple to integrate. Filters of may types can be realized with switched-capacitor circuits. In battery powered integrated circuits, or more generally when designing for low voltage supply and low power consumption, there exists the need for the circuits to function at extremely low voltages, such as down to about 1.5 V. Under these conditions it is difficult to efficiently drive the switches, which are most commonly provided by field effect (FET) transistors, usually MOSFETs.

Indeed, when the power supply is lowered down to levels comparable to those of the threshold voltage of the devices, the classical switched-capacitor structures as shown in the left hand portion of FIG. 1, may lose their effectiveness rapidly. To guarantee a correct functioning of the input switch S1 whose overdrive voltage depends upon the input signal, the operating voltage swing of the circuit should be limited.

A proposed solution to this problem that would ensure a high conductance under any input signal condition of the switches, and in particular of the input switch S1, rests on realizing the switches with low voltage threshold devices or on employing dedicated clock voltage multiplier circuits integrated in the device (voltage boosters) to overdrive the switches. This second approach, while overcoming the burden of having to diversify the manufacturing process to realize low threshold devices, unfortunately requires the integration of dedicated voltage boosters.

An alternative solution is based on the use of a switching structure called a "Switched Op-Amp" that is represented substantially by an operational amplifier, as is disclosed in the article: "Switched-Opamp, an approach to Realize Full CMOS Switched-Capacitor Circuits at Very Low Power Supply Voltages" by Jan Crols and Michel Steyaert, Journal of Solid State Circuits, Vol. 25, No. 8, August 1994, pages 936–942. According to this article, the proposed approach for ensuring a high conductance of the switches under any signal condition, and in particular of the input switch S1, rests upon substituting the MOSFET that is conventionally used as an input switch with a switched op-amp, driven ON and OFF through a switch. The other switches of the switched-capacitor structure may be realized with single n-channel or p-channel transistors without necessarily resorting to CMOS structures.

In the prior U.S. patent application No. 94830318.5, filed on Jun. 24, 1994, by the same assignee, whose content is herein incorporated by way of reference, there is described a low consumption switched-capacitor circuit employing an input switch, and a switched op-amp architecture. According to a preferred embodiment described in the previous patent application, the architecture of the switched op-amp is fully differential (that is, having a differential output). This doubles the voltage swing and offers the possibility of inverting the sign of the output signals by simply crossing the signal paths.

In this type of application, as well as in any other application involving a fully differential operational amplifier, it is necessary to implement a common mode control. The control of the common mode in a fully differential op-amp is carried out by sensing the common mode voltage at the amplifier's outputs and by applying such a signal, eventually filtered through a low-pass filter, such as an integrating stage, to a common mode input present in any differential output operational amplifier.

The known circuits for sensing and controlling the common mode in switched-capacitor circuits functioning at a relatively low supply voltage would require a supply voltage higher than the minimum voltage required for the proper functioning of the differential op-amp circuit which, as stated in the above noted references, may be equal to $VTH+2V_{ov}$. For this reason the known circuits used for common mode control cannot be used in switched op-amp structures for functioning at extremely low supply voltages.

SUMMARY OF THE INVENTION

An aim of the present invention is that of providing a common mode control circuit for a switched op-amp that will satisfactorily function even in switched-capacitor systems operating at a low supply voltage.

This objective is attained by the circuit of the invention by which a proper functioning of the nMOS switches coupled to the inverting input node of an integrating stage capable of outputting the desired common mode control signal, is made possible because the DC potential of such an inverting input node is kept to ground potential. Accordingly, the nMOS switches are not subject to the body effect on their threshold voltage characteristic. This condition is ensured by using a dedicated auxiliary capacitor capable of supplying to the inverting input node of the integrating stage an equivalent electric charge to that corresponding to the DC level existing on the output nodes of the operational amplifier and of keeping the input node of the integrating stage to ground potential during the switching phases.

Moreover, in the switched-capacitor circuits that couple the differential op-amp output nodes to the inverting input node of the integrating stage, there is yet another auxiliary capacitor that ensures an uninterrupted path between the input and the output of the common mode control circuit. A switch in series with this second auxiliary capacitor prevents its discharge during a cutoff phase of the operational amplifier, thus reducing the switch-on delay.

DETAILED DESCRIPTION OF THE PREFERRED EMBODIMENTS

Figure 1:
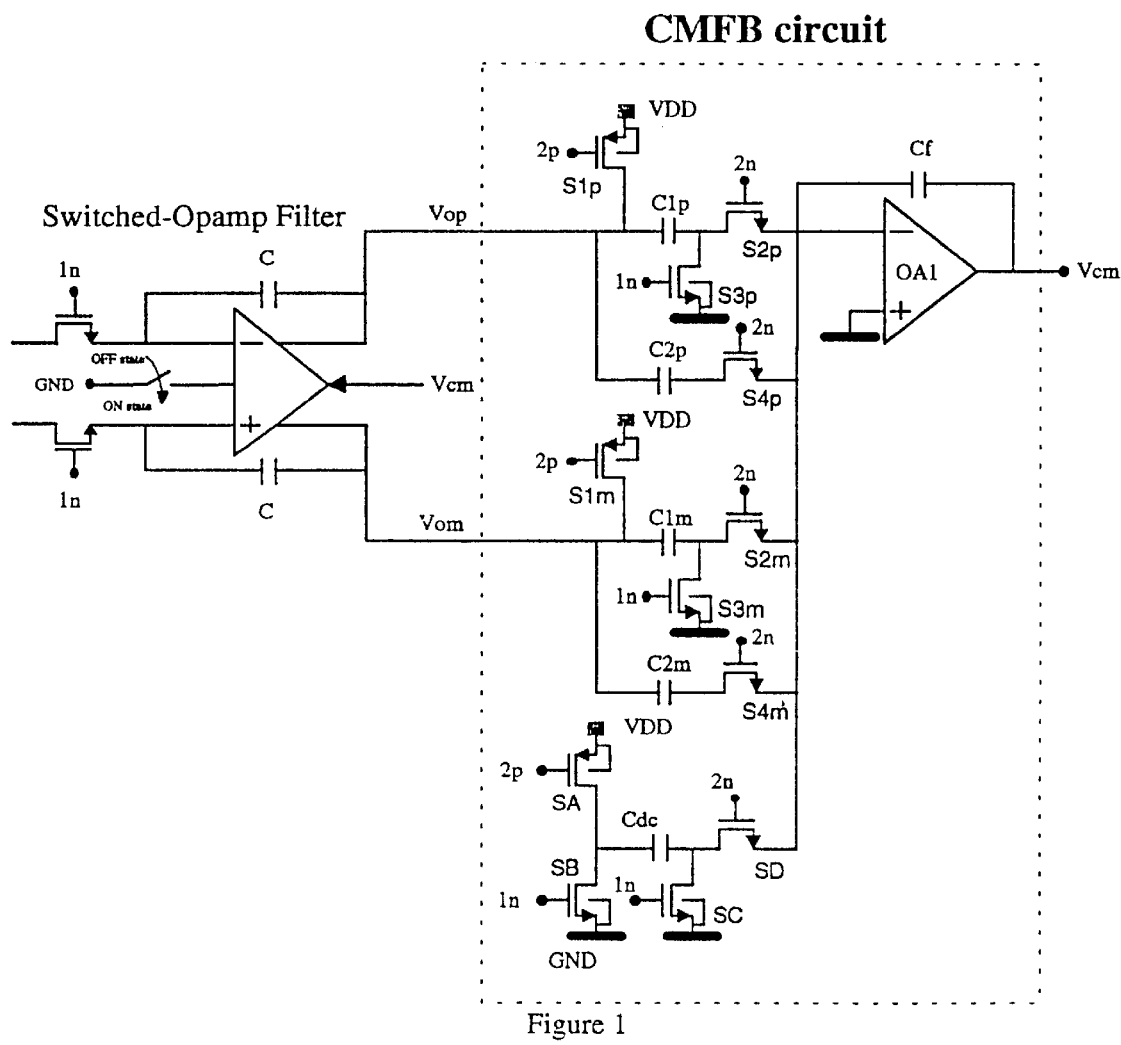
FIG. 1 is a schematic diagram of the circuit in accordance with the present invention.

The different aspects and advantages of the invention will become more evident through the following description of an important embodiment and by referring to the attached drawing. With reference to the circuit depicted in the figure, a generic fully differential operational amplifier, in a low-pass filter configuration (integrator), is shown on the left-hand side of the circuit diagram, externally to the block enclosed within the dotted line. The differential output amplifier (respectively Vop and Vom) is customarily provided with an input for a common mode control signal Vcm.

The circuit that generates a common mode control signal Vcm, which is the object of the present invention, is represented by the circuit portion enclosed within the dotted line perimeter and named "CMFB Circuit". The CMFB circuit comprises a switched-capacitor coupling network of the Vop and Vopm output nodes of the differential operational amplifier to the inverting input node (−) of an integrating stage represented by the op-amp OA1 and by the integrating capacitor Cf.

According to a first important aspect of the invention, the DC potential of the inverting input node (−) of the integrating stage OA1 and Cf is maintained ground potential by an auxiliary capacitor Cdc having a first plate that is switchingly coupled to the supply voltage VDD and ground GND through the respective switches SA and SB, which are controlled by the control phases 2p and 1n, respectively. The other plate of the capacitor Cdc is switchingly coupled to ground GND and to the inverting input node (−) of the integrating stage by the switches SC and SD, which are controlled by the control phases 2n and 1n, respectively.

Each of the two identical coupling circuits of the Vop and Vom outputs of the differential op-amp to the inverting input (−) of the integrating stage, comprises a first switched-capacitor, C1p and C1m, respectively, having a first plate coupled to the respective output node Vop and Vom of the differential operational amplifier. The output node is switched to the supply voltage VDD by means of a first switch, S1p and S1m, respectively, driven by the control phase 2p. The other plate of the first capacitors, C1p and C1m, is switched to the inverting input node (−) of the integrating stage through a second switch, S2p and S2m, respectively, or to ground through a third switch, S3p and S3m, respectively, driven by the control phases 2n and 1n, respectively. Each circuit further comprises an additional capacitor, respectively C2p and C2m, capable of providing a continuous electrical path from the input to the output of the CMFB circuit, and a fourth switch, respectively S4p and S4m, controlled by the control phase 2n for preventing the discharge of the auxiliary capacitor, C2p and C2m, during the cutoff phases of the operational amplifier.

As it may be observed, all the nMOS switches are connected to ground and all the PMOS switches are linked to VDD. In this way no body effect occurs and a minimum threshold value is retained by all the switches, thus avoiding the need to generate boosted voltages to ensure the correct functioning of the CMFB circuit.

That which is claimed is:

1. A circuit comprising:
   a differential amplifier having two outputs and a common mode control input; and
   a common mode control circuit connected to said differential amplifier, said common mode control circuit being switchable ON/OFF by control signals, said common mode control circuit comprising a sensing network and an integrating stage having an input connected to said sensing network for generating a common mode control signal fed to the common mode control input of said differential amplifier, said sensing network comprising
   a pair of complementary PMOS and NMOS switches, each switch is driven by a respective control signal of said control signals,
   a seventh NMOS switch and an eight NMOS switch,
   an auxiliary capacitor having a first plate switched between a supply and ground through the pair of complementary PMOS and NMOS switches, and having a second plate switched between ground and the input of said integrating stage by the seventh NMOS switch and by the eighth NMOS switch, and
   a pair of coupling circuits for selectively coupling each output of said differential amplifier to the input of said integrating stage, each of said pair of coupling circuits comprising first and second capacitors, a first PMOS switch, and second, third and fourth NMOS switches, the first capacitor having a first plate coupled to a respective output of said differential amplifier and which is switched to the supply through the first PMOS switch driven in phase with said PMOS switch of said complementary pair and having a second plate switched between the input of said integrating stage by the second NMOS switch driven in opposite phase with said first PMOS switch and ground by the third NMOS switch which is driven in phase with said NMOS switch of said complementary pair, the second capacitor having a first plate coupled to the first plate of said first capacitor and a second plate switched to the input of said integrating stage by the fourth NMOS switch driven in phase with said second NMOS switch.

2. A common mode control circuit being switchable ON/OFF by control signals for a differential amplifier having two outputs and a common mode control input, said common mode control circuit comprising:
   a sensing network and an integrating stage having an input connected to said sensing network for generating a common mode control signal fed to the common mode control input of the differential amplifier, said sensing network comprising
   a pair of complementary PMOS and NMOS switches, each switch is driven by a respective control signal of said control signals,
   a seventh NMOS switch and an eight NMOS switch,
   an auxiliary capacitor having a first plate switched between a supply and ground through the pair of complementary PMOS and NMOS switches, and having a second plate switched between ground and the input of said integrating stage by the seventh NMOS switch and by the eighth NMOS switch, and
   a pair of coupling circuits for selectively coupling each output of the differential amplifier to the input of said integrating stage, each of said pair of coupling circuits comprising first and second capacitors, a first PMOS switch, and second, third and fourth NMOS switches, the first capacitor having a first plate coupled to a respective output of the differential amplifier and which is switched to the supply through the first PMOS switch driven in phase with said PMOS switch of said complementary pair, and having a second plate switched between the input of said integrating stage by the second NMOS switch driven in opposite phase with said first PMOS switch and ground by the third NMOS switch which is driven in phase with said NMOS switch of said complementary pair, the second capacitor having a first plate coupled to the first plate of said first capacitor and a second plate switched to the input of said integrating stage by the fourth NMOS switch driven in phase with said second NMOS switch.

3. A common mode control circuit being switchable ON/OFF by control signals for a differential amplifier having two outputs and a common mode control input, said common mode control circuit comprising:

a sensing network; and an integrating stage connected to said sensing network for generating a common mode control signal fed to the common mode control input of the differential amplifier;

said sensing network comprising
- a pair of complementary PMOS and NMOS switches, each switch is driven by a respective control signal of said control signals,
- auxiliary capacitor means comprising a capacitor having a first plate for being switched between a supply and ground, and having a second plate for being switched between ground and an input of said integrating stage, and
- a pair of coupling circuits for selectively coupling each output of the differential amplifier to the input of said integrating stage.

4. A common mode control circuit according to claim 3 wherein each of said pair of coupling circuits comprises first and second capacitors, a first PMOS switch, and second, third and fourth NMOS switches, the first capacitor having a first plate coupled to a respective output of the differential amplifier and which is switched to the supply through the first PMOS switch driven in phase with said PMOS switch of said complementary pair and having a second plate switched between the input of said integrating stage by the second NMOS switch driven in opposite phase with said first PMOS switch and ground by the third NMOS switch which is driven in phase with said NMOS switch of said complementary pair, the second capacitor having a first plate coupled to the first plate of said first capacitor and a second plate switched to the input of said integrating stage by the fourth NMOS switch driven in phase with said second NMOS switch.

5. A method for common mode control being switchable ON/OFF by control signals for a differential amplifier having two outputs and a common mode control input, the common mode control method comprising the steps of:
- providing a sensing network and an integrating stage connected to said sensing network, the step of providing said sensing network comprising
  - providing a pair of complementary PMOS and NMOS switches each switch is driven by a respective control signal of said control signals,
  - providing a capacitor having a first plate for being switched between a supply and ground, and having a second plate for being switched between ground and an input of said integrating stage, and
  - selectively coupling each output of the differential amplifier to the input of said integrating stage; and
- generating a common mode control signal fed to the common mode control input of the differential amplifier from said sensing network and said integrating stage responsive to the control signals.

6. A method according to claim 5 wherein step of selectively coupling comprises providing a pair of coupling circuits with each comprising first and second capacitors, a first PMOS switch, and second, third and fourth NMOS switches, the first capacitor having a first plate coupled to a respective output of the differential amplifier and which is switched to the supply through the first PMOS switch driven in phase with said PMOS switch of said complementary pair and having a second plate switched between the input of said integrating stage by the second NMOS switch driven in opposite phase with said first PMOS switch and ground by the third NMOS switch which is driven in phase with said NMOS switch of said complementary pair, the second capacitor having a first plate coupled to the first plate of said first capacitor and a second plate switched to the input of said integrating stage by the fourth NMOS switch driven in phase with said second NMOS switch.

7. A common mode control circuit being switchable ON/OFF by control signals for a differential amplifier having two outputs and a common mode control input, said common mode control circuit comprising:
- a sensing network; and
- an integrating stage connected to said sensing network for generating a common mode control signal fed to the common mode control input of the differential amplifier, said integrating stage comprising an operational amplifier;
- said sensing network comprising a plurality of capacitors and switch means associated therewith for switching based upon the control signals, said switch means comprising at least one PMOS switch connected to the supply and at least one NMOS switch connected to ground.

8. A common mode control circuit according to claim 7, wherein said PMOS switch and said NMOS switch, each switch is driven by a respective control signal of said control signals;
- said sensing network further comprises auxiliary capacitor means comprising a capacitor having a first plate for being switched between a supply and ground by means of said PMOS switch and said NMOS switch, and having a second plate for being switched between ground and an input node of said operational amplifier; and
- a pair of coupling circuits for selectively coupling each output of the differential amplifier to the input of said operational amplifier.

9. A common mode control circuit according to claim 8, wherein each of said pair of coupling circuits comprises first and second capacitors, a first PMOS switch, and second, third and fourth NMOS switches, the first capacitor having a first plate coupled to a respective output of the differential amplifier and which is switched to the supply through the first PMOS switch driven in phase with said PMOS switch, and having a second plate switched between the input of said operational amplifier by the second NMOS switch driven in opposite phase with said first PMOS switch and ground by the third NMOS switch which is driven in phase with said NMOS switch, the second capacitor having a first plate coupled to the first plate of said first capacitor and a second plate switched to the input of said operational amplifier by the fourth NMOS switch driven in phase with said second NMOS switch.

* * * * *